(12) United States Patent
Ku et al.

(10) Patent No.: US 11,127,703 B2
(45) Date of Patent: Sep. 21, 2021

(54) SEMICONDUCTOR DEVICES

(71) Applicant: Taiwan Semiconductor Manufacturing Co., Ltd., Hsinchu (TW)

(72) Inventors: Chin-Yu Ku, Hsinchu (TW); Cheng-Lung Yang, Kaohsiung (TW); Chen-Shien Chen, Hsinchu County (TW); Hon-Lin Huang, Hsinchu (TW); Chao-Yi Wang, Tainan (TW); Ching-Hui Chen, Hsinchu (TW); Chien-Hung Kuo, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 16/372,437

(22) Filed: Apr. 2, 2019

(65) Prior Publication Data
US 2019/0229081 A1 Jul. 25, 2019

Related U.S. Application Data

(62) Division of application No. 15/652,251, filed on Jul. 18, 2017, now Pat. No. 10,276,528.

(51) Int. Cl.
*H01L 23/48* (2006.01)
*H01L 23/52* (2006.01)
(Continued)

(52) U.S. Cl.
CPC .......... *H01L 24/11* (2013.01); *H01L 21/6835* (2013.01); *H01L 21/6836* (2013.01); *H01L 21/78* (2013.01); *H01L 23/3185* (2013.01); *H01L 24/13* (2013.01); *H01L 24/96* (2013.01); *H01L 24/97* (2013.01); *H01L 23/3114* (2013.01); *H01L 2221/68327* (2013.01); *H01L 2221/68354* (2013.01); *H01L 2221/68381* (2013.01); *H01L 2224/10122* (2013.01); *H01L 2224/11009* (2013.01); *H01L 2224/11464* (2013.01); *H01L 2224/13014* (2013.01); *H01L 2224/1357* (2013.01); *H01L 2224/13144* (2013.01); *H01L 2224/13155* (2013.01);
(Continued)

(58) Field of Classification Search
CPC ....... H01L 2224/48227; H01L 25/0657; H01L 25/50; H01L 23/3128; H01L 2224/13009; H01L 2224/81191
See application file for complete search history.

(56) References Cited

U.S. PATENT DOCUMENTS 9,412,719 B2 * 8/2016 Tsai .................... H01L 25/0657
2008/0194095 A1 * 8/2008 Daubenspeck ..... H01L 23/3192
438/612

(Continued)

*Primary Examiner* — Bradley Smith
*Assistant Examiner* — David J Goodwin
(74) *Attorney, Agent, or Firm* — JCIPRNET

(57) ABSTRACT

Semiconductor devices are provided. The semiconductor device includes a first dielectric layer, a bump, an etching stop layer and a spacer. The first dielectric layer is disposed over and exposes a conductive structure. The bump is partially disposed in the first dielectric layer to electrically connect the conductive structure. The etching stop layer is disposed over the first dielectric layer aside the bump. The spacer surrounds the bump and disposed between the etching stop layer and the bump.

20 Claims, 20 Drawing Sheets

(51) Int. Cl.
  *H01L 23/00*   (2006.01)
  *H01L 21/78*   (2006.01)
  *H01L 21/683*  (2006.01)
  *H01L 23/31*   (2006.01)

(52) U.S. Cl.
  CPC ............ *H01L 2224/13164* (2013.01); *H01L 2224/13553* (2013.01); *H01L 2224/13564* (2013.01); *H01L 2224/13644* (2013.01); *H01L 2224/95001* (2013.01); *H01L 2924/1431* (2013.01); *H01L 2924/1433* (2013.01)

(56) References Cited

U.S. PATENT DOCUMENTS

| | | | |
|---|---|---|---|
| 2010/0178761 A1* | 7/2010 | Chen | H01L 23/49816 438/613 |
| 2010/0207226 A1* | 8/2010 | Park | H01L 27/14623 257/432 |
| 2012/0018883 A1* | 1/2012 | Shen | H01L 24/03 257/737 |
| 2014/0084473 A1* | 3/2014 | Moon | H01L 21/30625 257/751 |
| 2014/0264709 A1* | 9/2014 | Tsai | H01L 21/76879 257/459 |
| 2015/0294948 A1* | 10/2015 | Ayotte | H01L 24/81 257/737 |
| 2017/0200697 A1* | 7/2017 | Kao | H01L 25/0655 |

\* cited by examiner

SEMICONDUCTOR DEVICES

CROSS-REFERENCE TO RELATED APPLICATION

This is a continuation application of and claims priority benefit of U.S. application Ser. No. 15/652,251, filed on Jul. 18, 2017 and now allowed. The entirety of the above-mentioned patent application is hereby incorporated by reference herein and made a part of this specification.

BACKGROUND

Generally, a wafer may be bonded to a carrier though an adhesive layer, and then a die can be formed from the wafer by a singulation process. After that, the die may be picked from the carrier and placed on an electronic device. However, a chemical used in the singulation process may damage a component or a layer of the die. In addition, the pick and place operation is affected if the improper adhesion is formed between a bump of the die and the carrier. As a result, the reliability and the yield are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
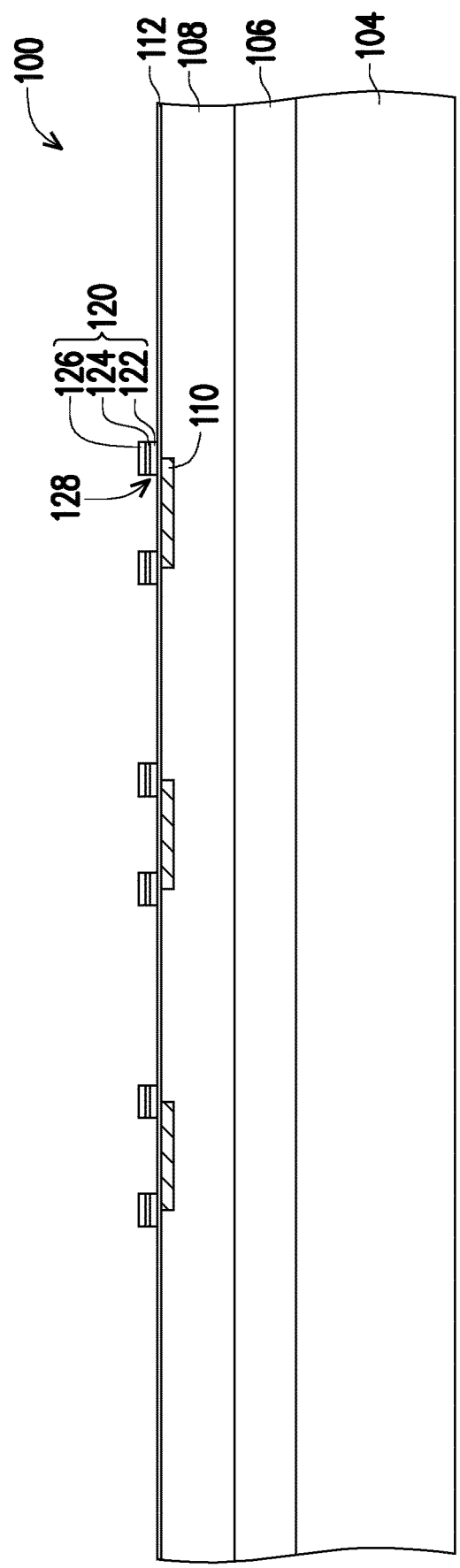
FIG. 1A to FIG. 1G are schematic cross sectional views of various stages in a manufacturing method of a semiconductor device according to some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross sectional views of various stages in a manufacturing method of a semiconductor device according to some exemplary embodiments. In some embodiments, for clarity, one die region for forming one die is depicted, however, more dies can be obtained by the manufacturing method of the semiconductor device.

Referring to FIG. 1A, in some embodiments, a wafer 100 is provided, and the wafer 100 includes a substrate 104, an active device layer 106 and a conductive structure 108. The substrate 104 may be a semiconductor substrate, such as a silicon substrate, although it may be formed of other semiconductor materials including, and not limited to, silicon germanium, silicon carbon, gallium arsenide, or the like. The active device layer 106 is a doped layer, for example. In some embodiments, the active device layer 106 include transistors, resistors, capacitors, inductors, and/or the like. The conductive structure 108 may be an interconnect structure, and includes conductive layers 110 and vias (not shown). For clarity, only the topmost conductive layer 110 is shown in FIG. 1A. The conductive layers 110 and vias are electrically coupled to the active device layer 106. The conductive layers 110 and vias may include copper or copper alloys, and may be formed using damascene processes. In alternative embodiments, the conductive layers 110 and vias include aluminum, titanium, nickel, tungsten, silver and/or alloys thereof. The conductive structure 108 may include a plurality of dielectric layers (not shown), which may include an Inter-Layer Dielectric (ILD) and Inter-Metal Dielectrics (IMDs), and the conductive layers 110 and vias are disposed in the dielectric layers.

Then, a dielectric layer 112 is formed over the wafer 100. In some embodiments, the dielectric layer 112 is formed by a blanket deposition process such as a chemical vapor deposition (CVD) process or any suitable process. The dielectric layer 112 is silicon nitride or any suitable material, for example. After that, a dielectric layer 120 is formed over a portion of the dielectric layer 112. In some embodiments, the dielectric layer 120 includes an opening 128 to expose a portion of the dielectric layer 112 over the conductive layer 110. In some embodiments, the dielectric layer 120 is a composite layer such as an oxide-nitride-oxide layer (O—N—O) layer, and the dielectric layer 120 includes a layer 122 of oxide, a layer 124 of nitride, and a layer 126 of oxide, for example. In alternative embodiments, the dielectric layer 120 may be a single layer and include any suitable material.

Figure 1B:
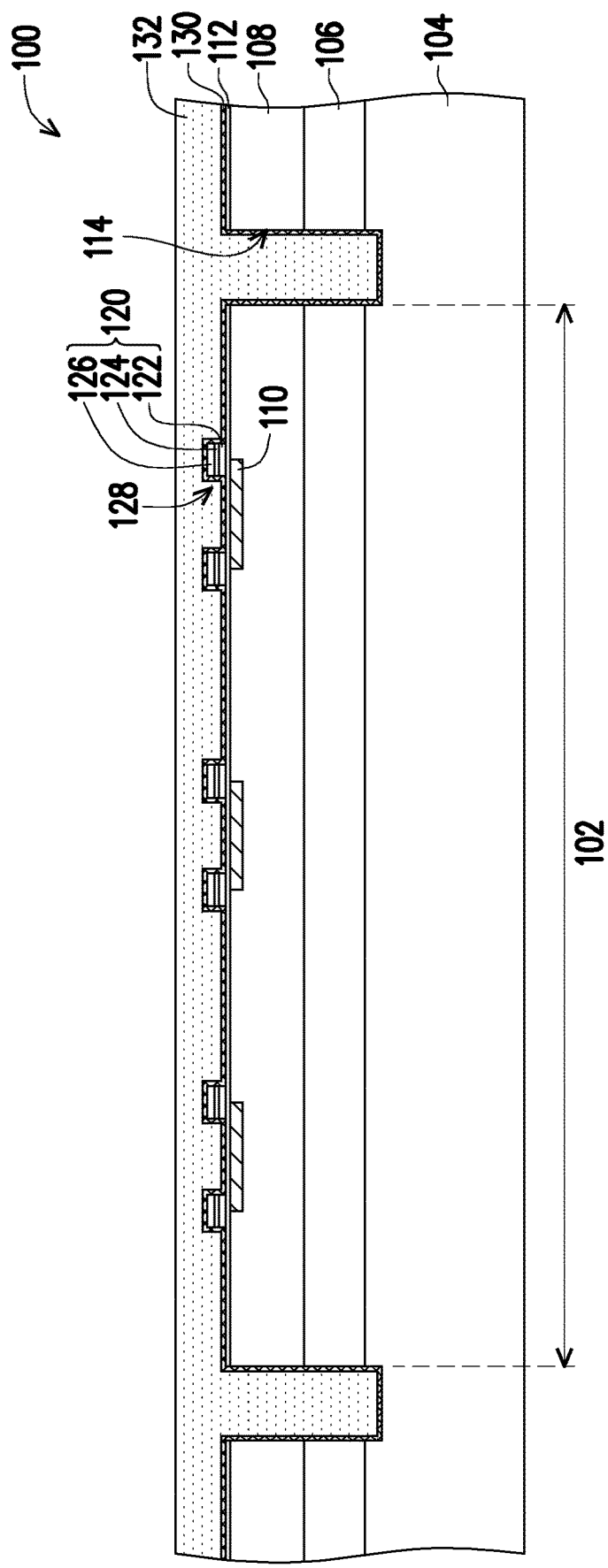

Referring to FIG. 1B, a plurality of trenches 114 is formed to expose the substrate 104, and a die region 102 is formed between the adjacent trenches 114. In some embodiments, the trenches 114 are formed by removing portions of the active device layer 106, the conductive structure 108 and the substrate 104. In some embodiments, the dielectric layer 112 over the conductive structure 108 is also removed. Thus, after forming the trenches 114, the dielectric layer 112 is disposed over a top surface of the conductive structure 108 in the die region 102 without extending into the trenches 114.

Then, an etching stop layer 130 is conformally formed over the wafer 100. In some embodiments, the etching stop layer 130 is formed over exposed surfaces of the dielectric layer 112, the dielectric layer 120, and the trenches 114. In some embodiments, the dielectric layer 120 is disposed between the etching stop layer 130 and the dielectric layer 112. In some embodiments, the etching stop layer 130 is formed by a blanket deposition process such as an atomic layer deposition (ALD) process or any suitable process. In some embodiments, the etching stop layer 130 includes metal oxide such as aluminum oxide ($Al_2O_3$) or any suitable material. Thereafter, a sacrificial layer 132 is formed over the etching stop layer 130 and fills the trenches 114. In some embodiments, the sacrificial layer 132 is formed by a deposition process such as a CVD process or any suitable process. In some embodiments, the sacrificial layer 132 includes dielectric material such as silicon oxide or any suitable material. A material of the etching stop layer 130 has an etching selectivity with respect to the sacrificial layer 132, and thus the etching stop layer 130 protects other structures during the removal of the sacrificial layer 132.

Figure 1C:
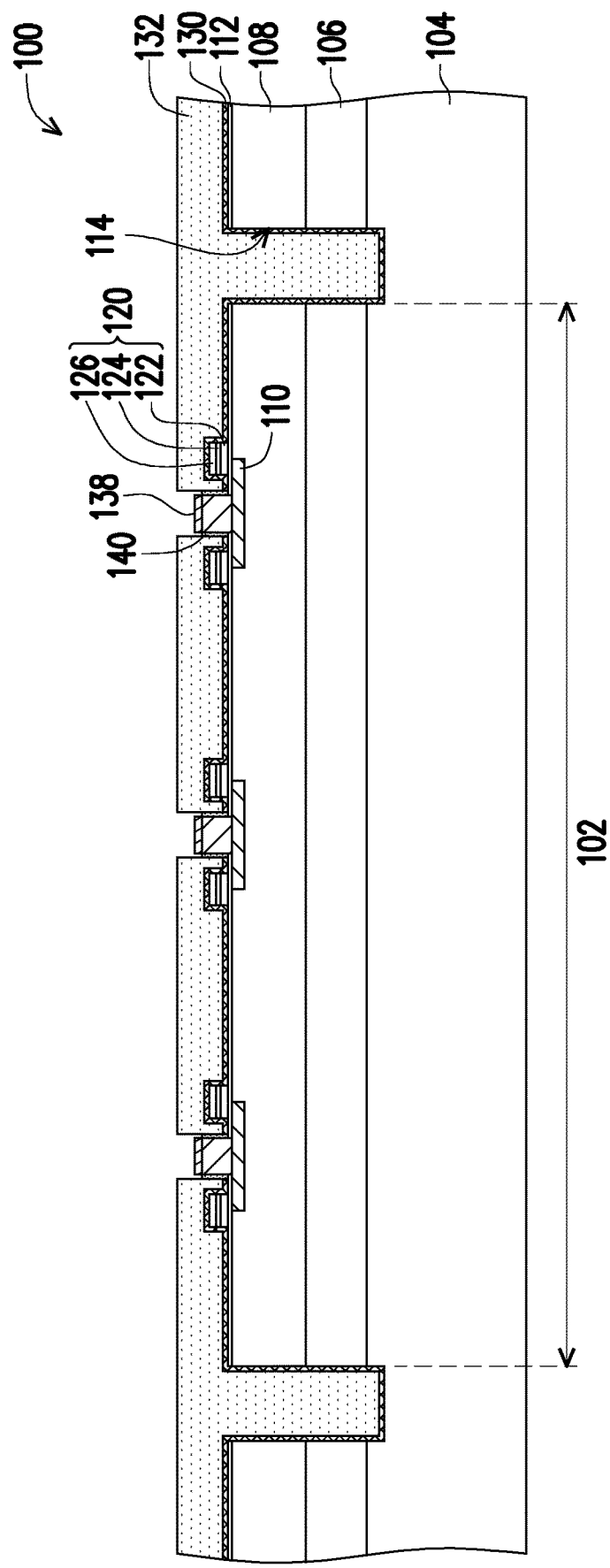

Referring to FIG. 1C, a bump 138 with a spacer 140 is formed to electrically connect the conductive layer 110. FIGS. 2A to 2D are cross-sectional views illustrating a manufacturing process of the bump 138 and the spacer 140 depicted in FIG. 1C, according to some exemplary embodiments. It should be noted that the illustrations depicted in FIGS. 2A to 2D merely serve as examples for demonstration. As such, scales, dimensions, and shapes illustrated in FIGS. 2A to 2D may not completely reflect the bump 138 and the spacer 140 illustrated in FIG. 1B. However, same elements are denoted by the same reference numeral to establish a correlation between FIGS. 2A to 2D and FIG. 1C.

Figure 2A:
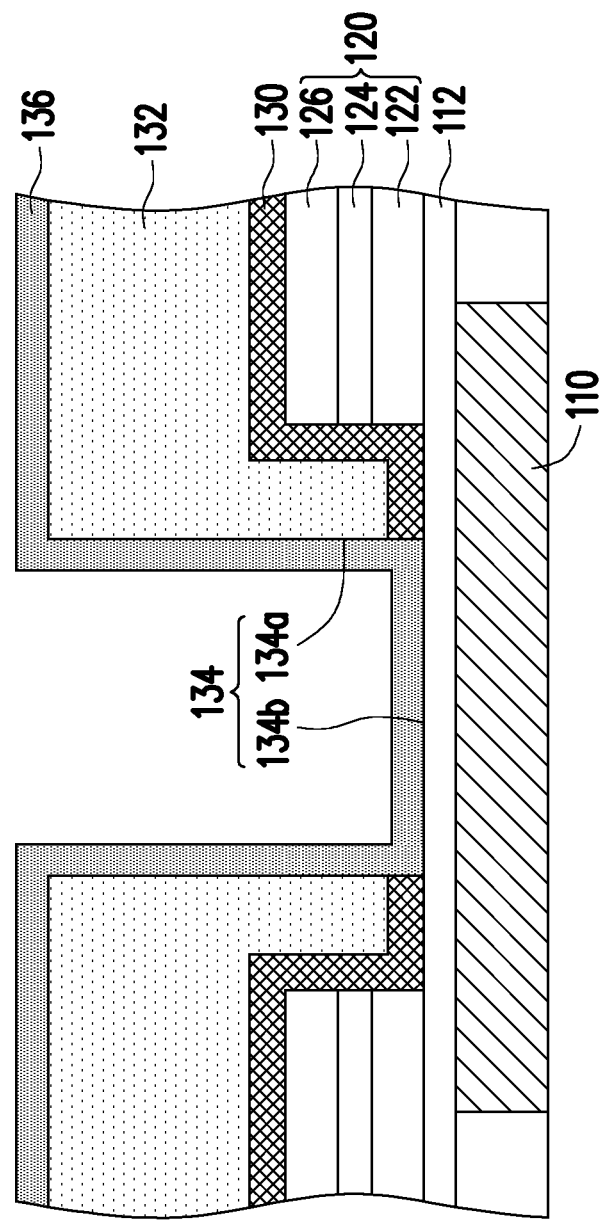
FIGS. 2A to 2D are cross-sectional views illustrating a manufacturing process of the bump and the spacer depicted in FIG. 1C, according to some exemplary embodiments.

Referring to FIG. 2A, portions of the etching stop layer 130 and the sacrificial layer 132 are removed, so as to form an opening 134 over the conductive layer 110. The opening 134 has a sidewall 134a and a bottom 134b. In some embodiments, the etching stop layer 130 and the sacrificial layer 132 are removed respectively, for example. Then, a spacer layer 136 is formed over the wafer 100, so as to cover a top surface of the sacrificial layer 132 and the sidewall 134a and the bottom 134b of the opening 134. In some embodiments, the spacer layer 136 is formed by a blanket deposition process such as a CVD process or any suitable process. In some embodiments, the spacer layer 136 includes metal nitride such titanium nitride (TiN) or any suitable material.

Figure 2B:
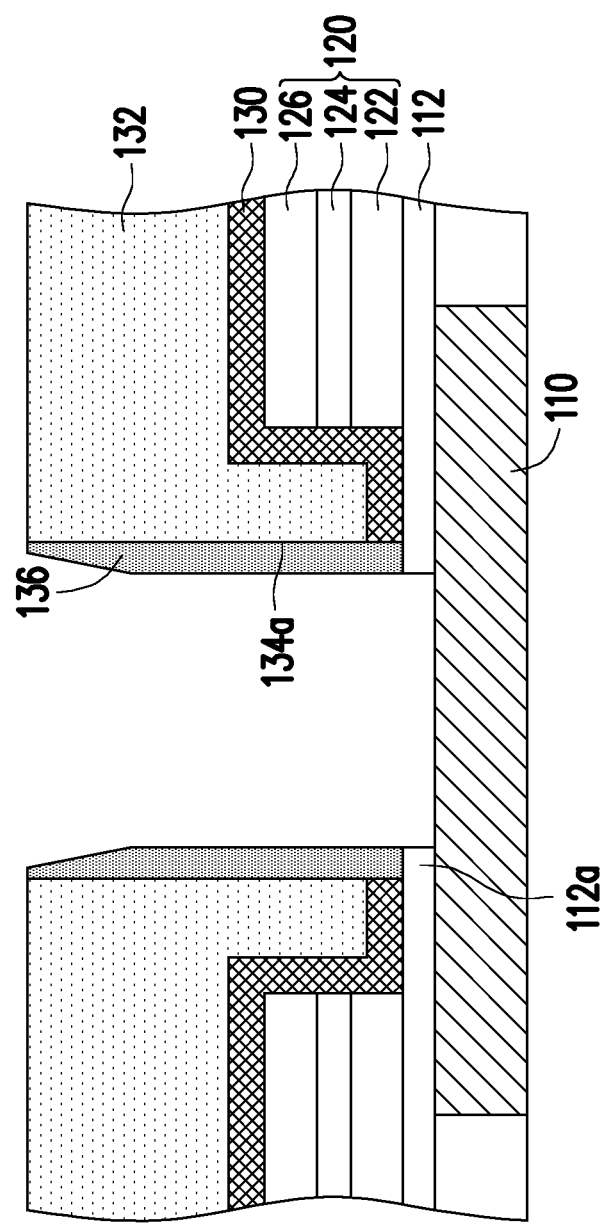

Referring to FIG. 2B, portions of the spacer layer 136 and the dielectric layer 112 over the conductive layer 110 are removed, so as to expose the conductive layer 110. In some embodiments, an anisotropic etching such as a dry etching process is performed to remove the spacer layer 136 over the top surface of the sacrificial layer 132 and the bottom 134b of the opening 134. It is noted that a portion 112a of the dielectric layer 112 is not removed since covered by the spacer layer 136 on the sidewall 134a of the opening 134. In some embodiments, the dielectric layer 112 over the conductive layer 110 and the spacer layer 136 may be removed simultaneously or separately. In some embodiments, a portion of the spacer layer 136 on a top portion of the sidewall 134a is also removed, and thus the spacer layer 136 may have a tilt top surface.

Figure 2C:
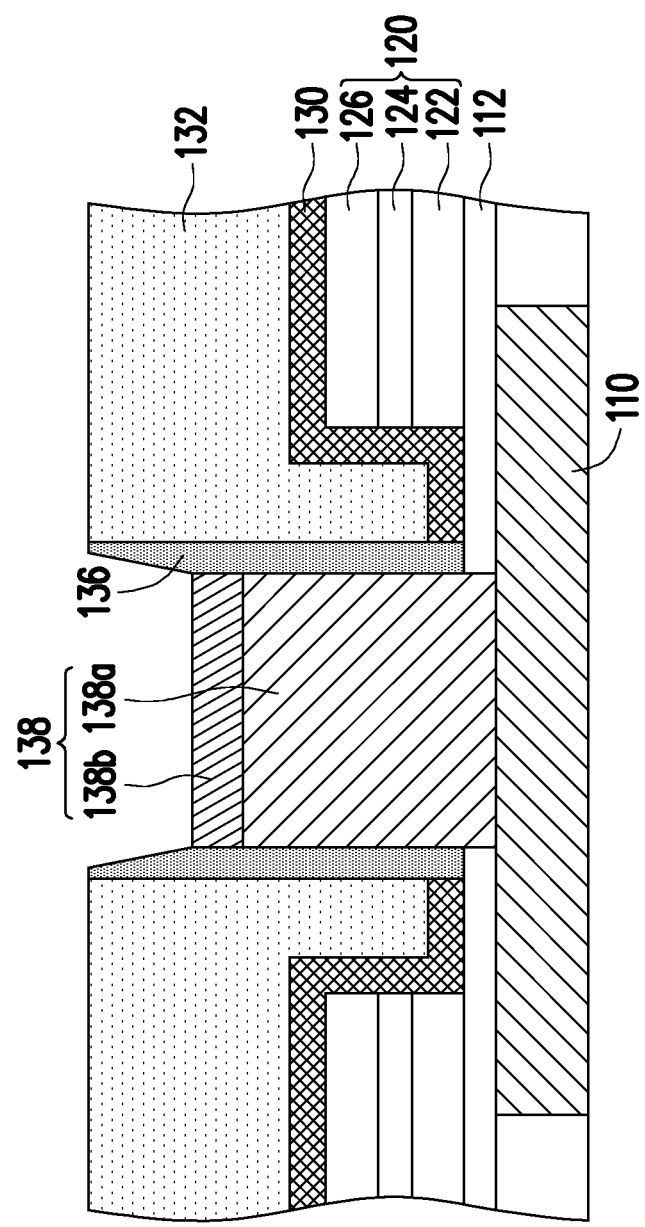

Referring to FIG. 2C, a bump 138 is formed in the opening 134. In some embodiments, the bump 138 is surrounded by and in contact with the spacer layer 136, that is, the bump 138 fills a portion of the space formed by the spacer layer 136. In some embodiments, a top of the bump 138 is lower than a top of the spacer layer 136 and higher than a top of the etching stop layer 130. In some embodiments, the bump 138 includes a conductive pillar 138a and a solder 138b thereon, and a top of the solder 138b is lower than the top of the spacer layer 136. The bump 138 is formed by an electroless plating process or any suitable process. The coefficient of thermal expansion (CTE) of the etching stop layer 130 and CTE of the sacrificial layer 132 are different from the CTE of the bump 138. In some embodiments, the conductive pillar 138a includes nickle (Ni) and the solder 138b includes gold (Au), for example. In alternative embodiments, the bump 138 may have a material of Ni/Pd/Au or any suitable metal. In some embodiments, a size of the bump 138 is smaller than 3 μm or 2 μm, and a pitch of the bump 138 is not smaller than 2 μm, for example. A thickness of the solder 138b ranges from 0.01 μm to 0.5 μm, and a thickness of the conductive pillar 138a ranges from 0.1 μm to 2 μm, for example. However, it is appreciated that the scope of this disclosure is not limited to the materials and descriptions disclosed above.

Figure 2D:
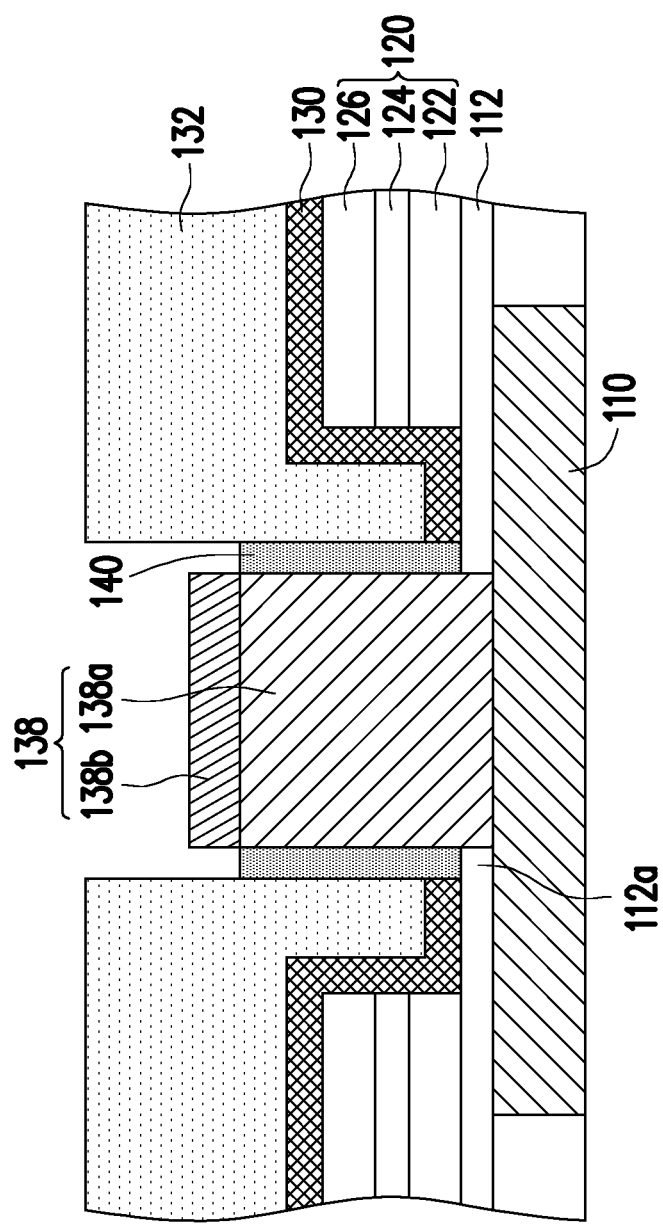

Referring to FIG. 2D, a portion of the spacer layer 136 is removed to form a spacer 140 on the bump 138. In some embodiments, a portion of the spacer layer 136 is removed by an etching process such as a wet etching process. The spacer 140 surrounds the bump 138, and the spacer 140 is in contact with the etching stop layer 130 and the bump 138 and seals the gap between the etching stop layer 130 and the bump 138. In some embodiments, the spacer 140 lands on the dielectric layer 112a between the etching stop layer 130 and the bump 138. A portion of the etching stop layer 130 is extended over the dielectric layer 112 between the spacer 140 and the dielectric layer 120. In some embodiments, a top of the spacer 140 is lower than the top of the bump 138, and thus at least a portion of the sidewall of the bump 138 is not covered by the spacer 140. In some embodiments, a top of the solder 138b is exposed, and a sidewall of the solder 138b is not covered by the spacer 140. That is, a total amount of a thickness of the dielectric layer 112 and a height of the spacer 140 is not larger than a height of the conductive pillar 138a. In some embodiments, a thickness of the spacer 140 is less than or equal to 1000 angstroms such as ranging from 100 angstroms to 1000 angstroms.

Figure 1D:
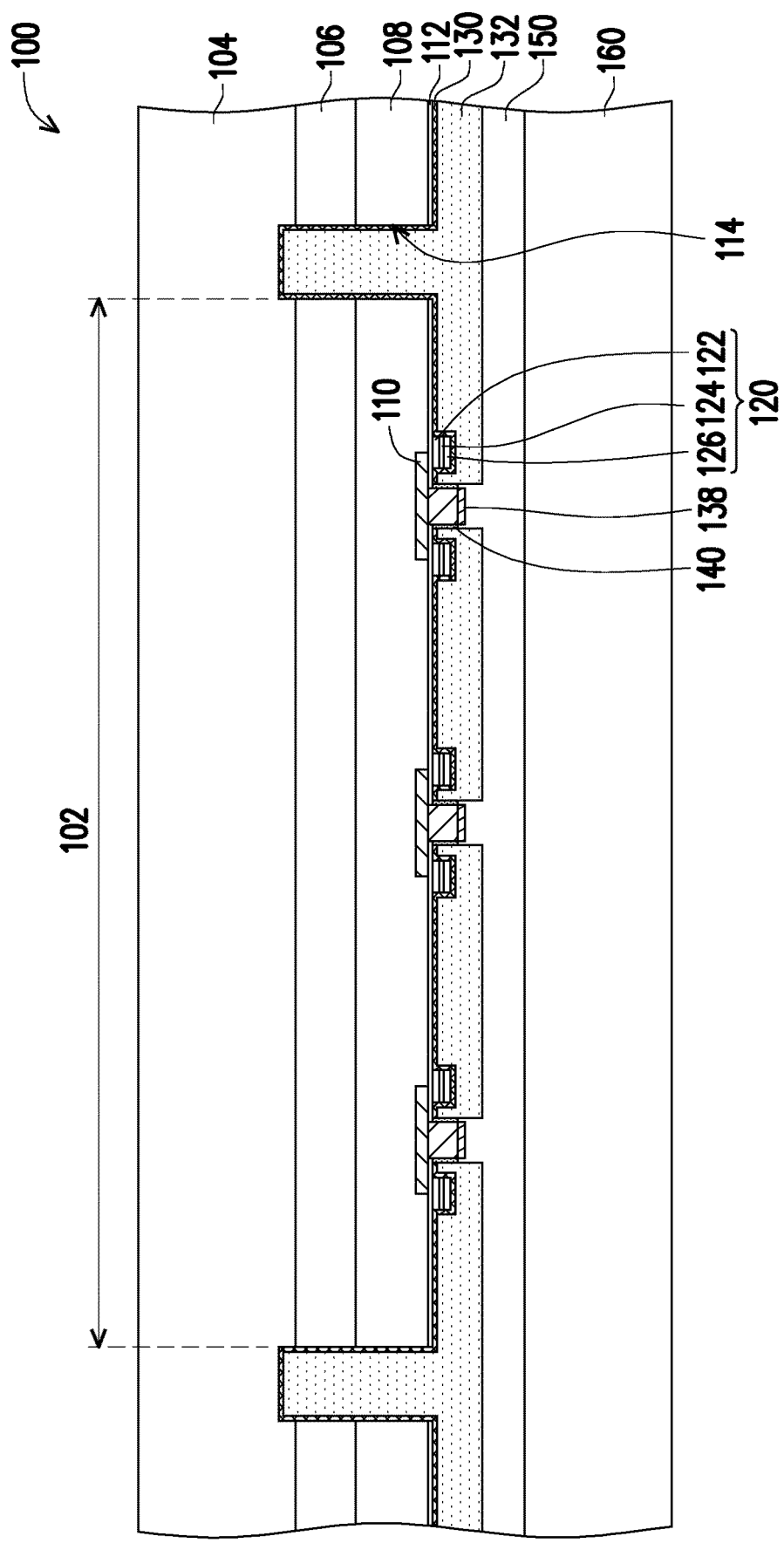

Referring to FIG. 1D, the wafer 100 is turned upside down and bonded to a carrier 160 through an adhesive layer 150, and the adhesive layer 150 is disposed between the carrier 160 and the wafer 100. In some embodiments, the adhesive layer 150 is in contact with the bump 138 by filling the space formed among the sacrificial layer 132, the spacer 140 and the bump 138. Thus, a portion of the adhesive layer 150 is extended into the space and is formed as a protrusion. In some embodiments, the carrier 160 may be a glass carrier or any suitable carrier for carrying a semiconductor wafer or a reconstituted wafer. The adhesive layer 150 includes a dielectric layer made of a dielectric material including benzocyclobutene ("BCB"), polybenzooxazole ("PBO") or any suitable dielectric material.

Figure 1E:
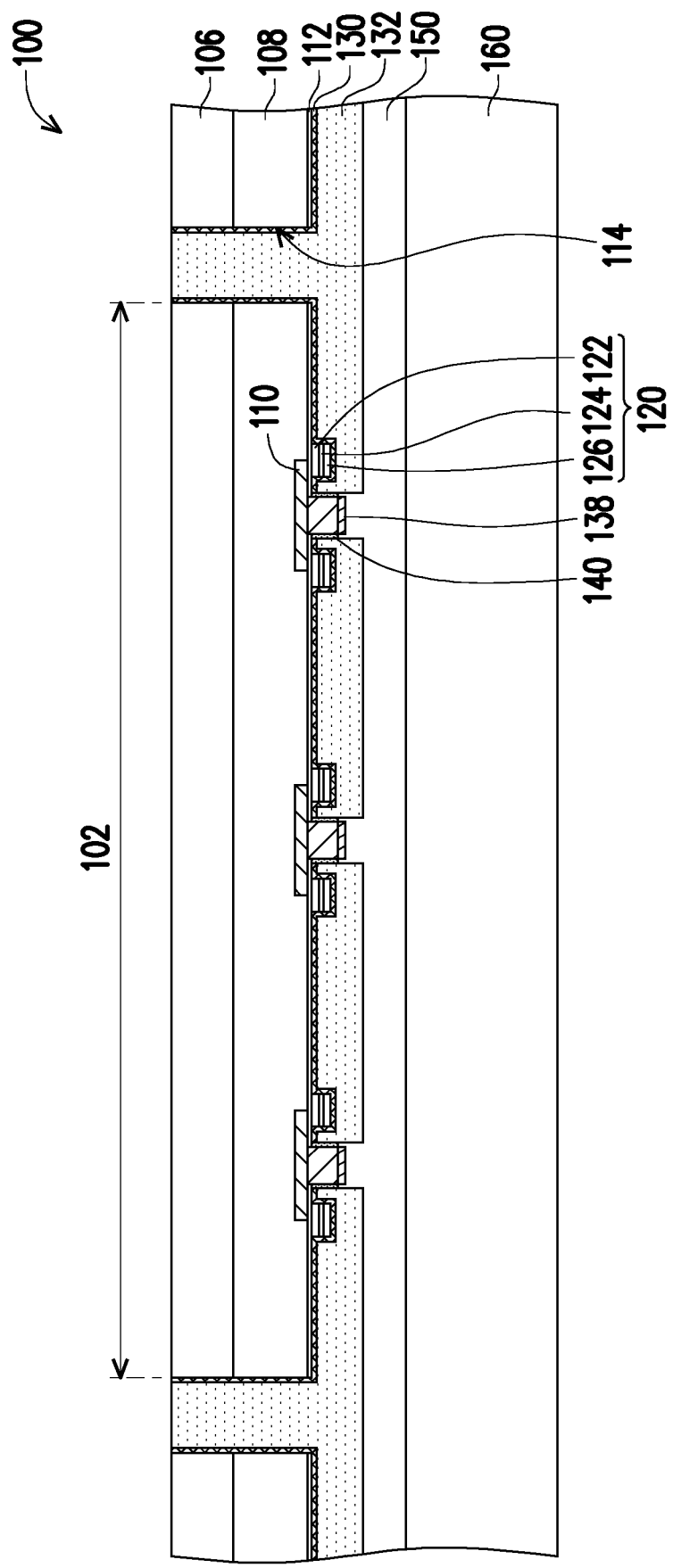

Referring to FIG. 1E, the substrate 104 is removed, so as to expose the sacrificial layer 132 in the trenches 114. In some embodiments, the substrate 104 is removed by a grinding process or a chemical mechanical polishing ("CMP") process. In some embodiments, the etching stop layer 130 on bottoms of the trenches 114 in FIG. 1C is also removed, and thus the sacrificial layer 132 is exposed.

Figure 1F:
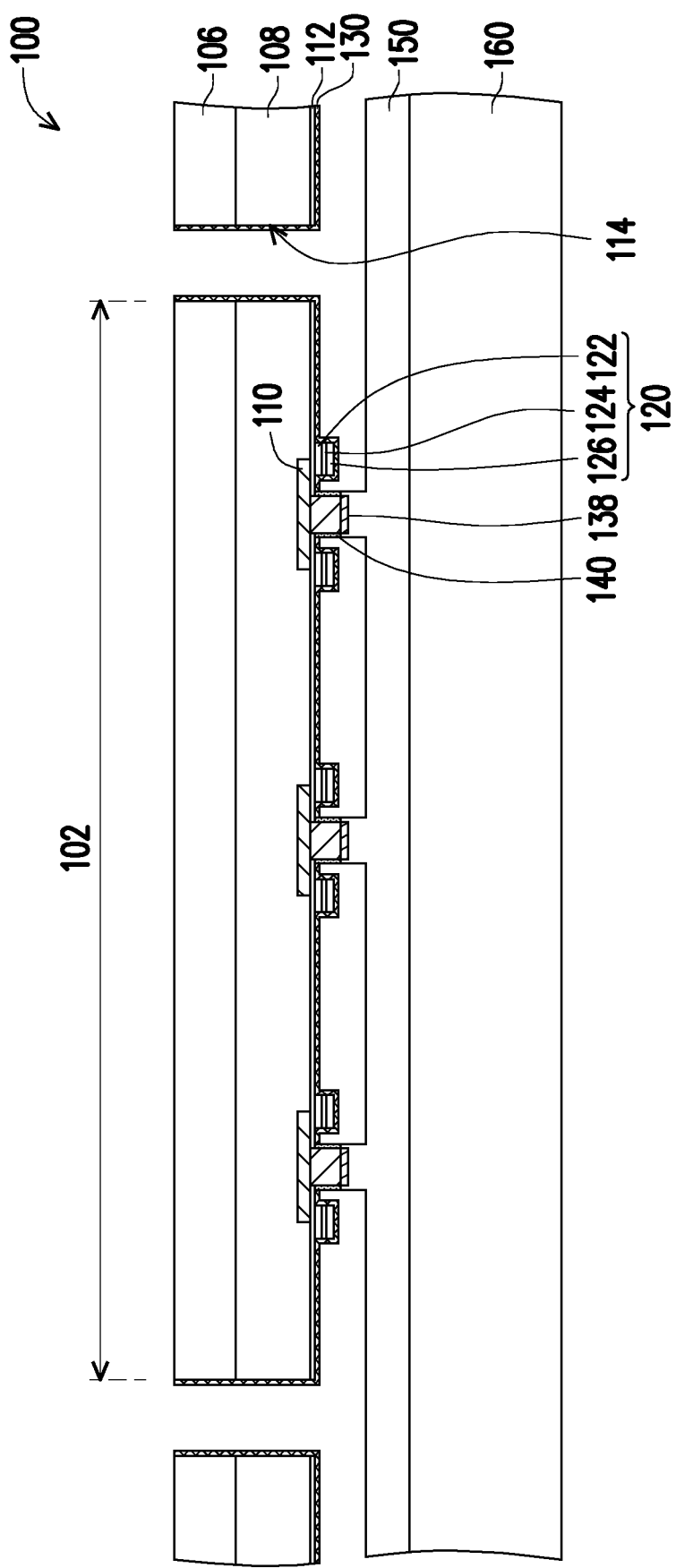

Referring to FIG. 1F, the sacrificial layer 132 is removed, and a die 200 is formed. In some embodiments, the sacrificial layer 132 is removed through the exposed trenches 114. Particularly, the sacrificial layer 132 is removed by using an etchant such as a vapor hydrogen fluoride (HF) or any suitable chemical, and the etchant is in contact with the sacrificial layer 132 through the exposed trenches 114. In some embodiments, after removing the sacrificial layer 132, the die 200 including the active device layer 106, the conductive structure 108, the dielectric layers 112 and 120, the etching stop layer 130 and the bumps 138 with the spacer 140 in the die region 102 is formed and separated from the other dies. Accordingly, this process is also referred to a singulation procedure.

Figure 1G:
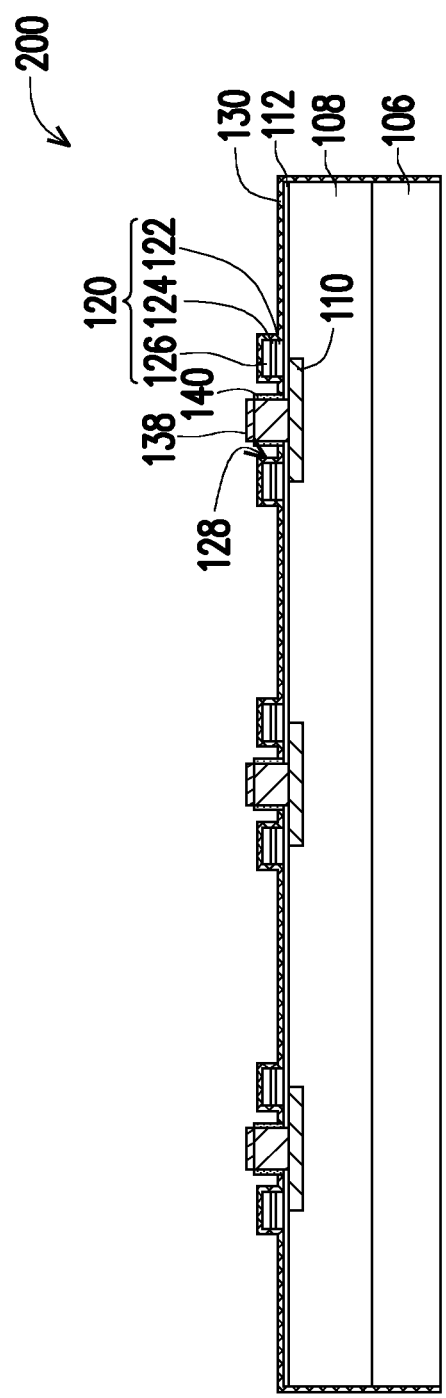

Referring to FIG. 1G, the die 200 is debonded from the carrier 160. In some embodiments, the bump 138 is partially disposed in the dielectric layer 112, and the spacer 140 is disposed on the sidewall of the bump 138 and between the etching stop layer 130 and the bump 138. In some embodiments, the etching stop layer 130 covers the side and top surfaces of the die 200 except the surfaces of the bumps 138 and the spacers 140. In some embodiments, the die 200 may be a micro-driver since the size thereof is not larger than 150 μm×30 μm, which is significantly smaller than a normal die size of 10 mm×10 mm. In some embodiments, the die 200 may be digital chips, analog chips or mixed signal chips, such as application-specific integrated circuit ("ASIC") chips, sensor chips, wireless and radio frequency chips, memory chips, logic chips or voltage regulator chips.

Generally, the adhesion between the etching stop layer and the bump is poor after heating since the CTEs thereof are different, and delamination or peeling of the etching stop layer from the bump is liable to occur. Therefore, the etchant such as vapor HF used in the singulation procedure may penetrate into the dielectric layer through the gap formed between the etching stop layer and the bump, and the dielectric layer may be damaged and the bump may crack. As a result, the reliability of the semiconductor device is lowered. However, in some embodiments, the spacer is formed between the etching stop layer and the bump and acts as a glue layer to improve the interface adhesion. Accordingly, the delamination or peeling between the etching stop layer and the bump is eliminated, and the damage to the dielectric layer and the conductive layer or the crack of the bump can be prevented since the etching stop layer may function as a barrier layer. Therefore, the reliability and the integrity of the bump are improved.

FIG. 3A to FIG. 3G are schematic cross sectional views of various stages in a manufacturing method of a semiconductor device according to some exemplary embodiments.

Figure 3A:
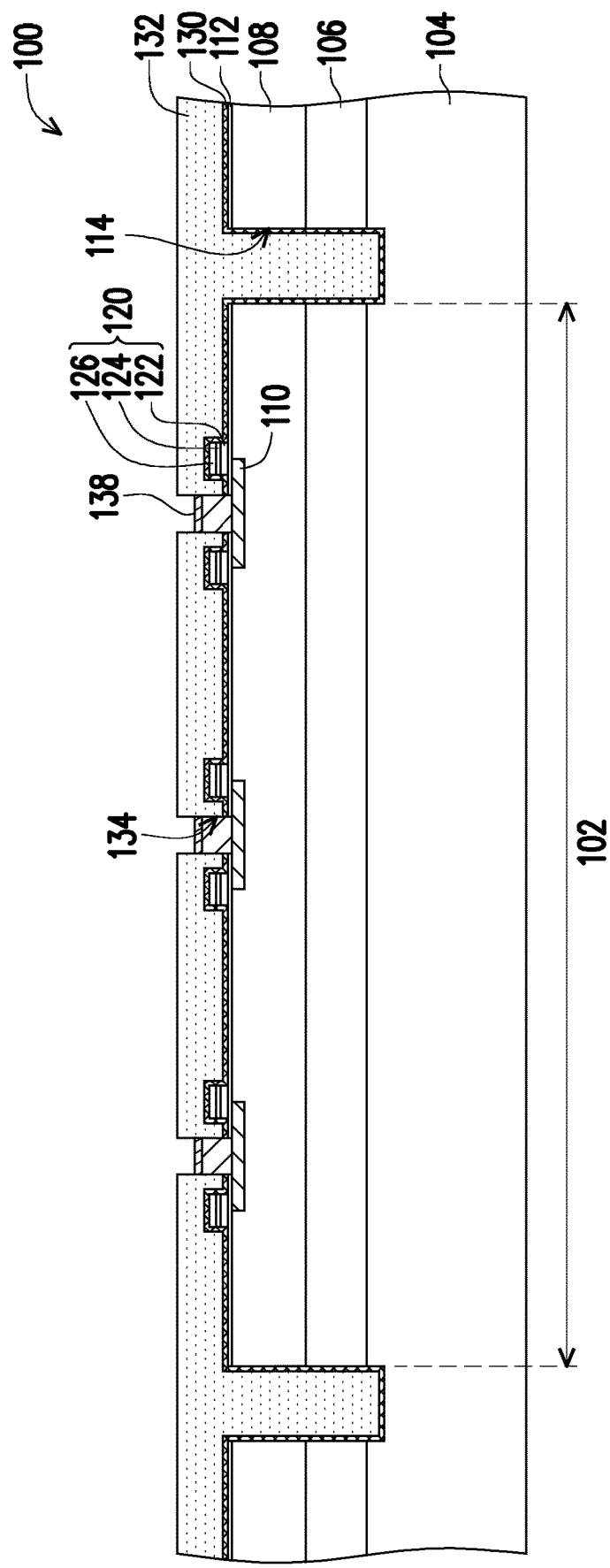
FIG. 3A to FIG. 3G are schematic cross sectional views of various stages in a manufacturing method of a semiconductor device according to some exemplary embodiments.

Referring to FIG. 3A, a bump 138 is formed to electrically connect a conductive layer 112 of a wafer 100. In some embodiments, the wafer 100 includes a substrate 104, an active device layer 106 and a conductive structure 108. In some embodiments, the bump 138 is formed in an opening 134 passing through a dielectric layer 112, an etching stop layer 130 and a sacrificial layer 132 over the conductive structure 108, and the etching stop layer 130 is formed between the dielectric layer 112 and the sacrificial layer 132. In some embodiments, a dielectric layer 120 is formed between the etching stop layer 130 and the dielectric layer 112. A top of the bump 138 is lower than a top of the sacrificial layer 132. In some embodiments, as shown in FIG. 4B, a top surface of the bump 138 is a circle. In alternative embodiments, the top surface of the bump 138 is shaped like or nearly like a circle, such as a polygon with vertexes larger than 4, including a pentagon, a hexagon, a heptagon, an octagon and so on. In alternative embodiments, the top surface of the bump 138 is an ellipse in which the angle of the major axis to the vertical axis is 0 to 90 degrees or any suitable shape. In some embodiments, the bump 138 is formed by an electroless plating process or any suitable process. In some embodiments, the bump 138 includes a conductive pillar 138a and a solder 138b thereon. In some embodiments, the conductive pillar 138a includes nickle (Ni) and the solder 138b includes gold (Au), for example. In alternative embodiments, the bump 138 may have a material of Ni/Pd/Au. The structures, the forming methods and the materials of the wafer 100, the dielectric layer 112, the etching stop layer 130 and the sacrificial layer 132 can referred to the above embodiments, and the details thereof are omitted. However, it is appreciated that the scope of this disclosure is not limited to the materials and descriptions disclosed above.

Figure 3B:
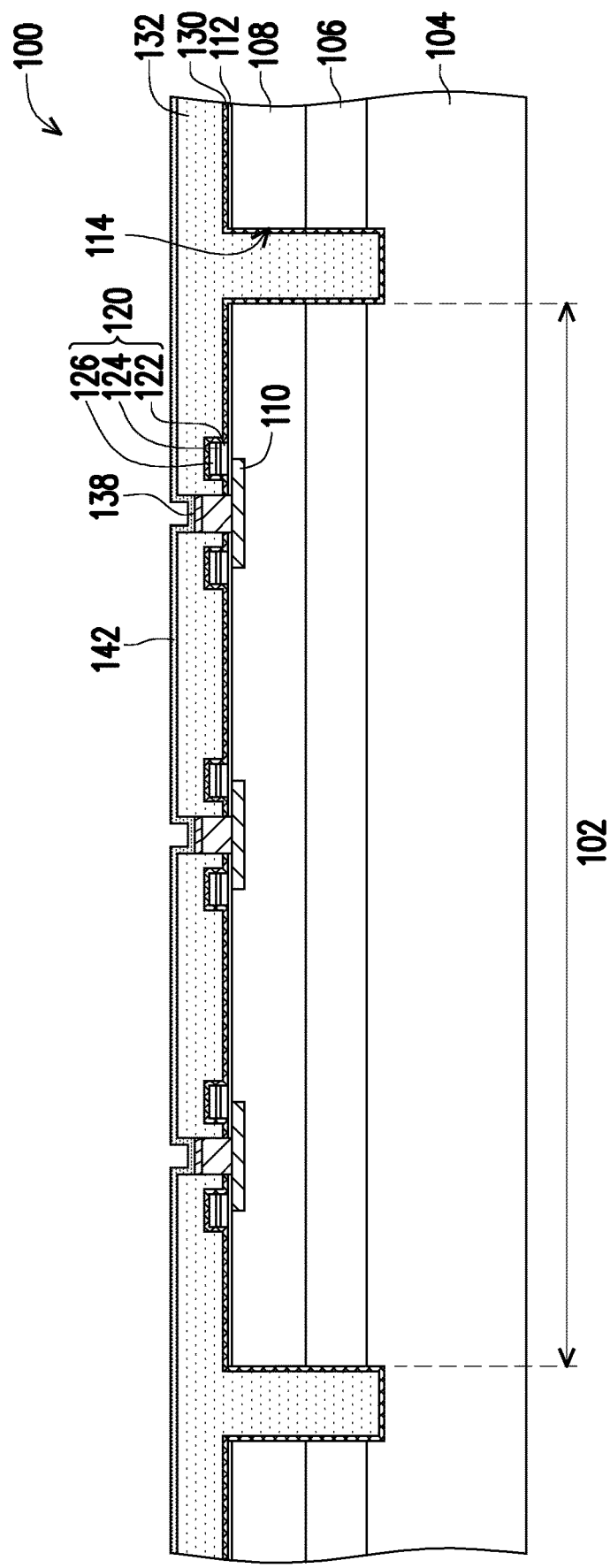

Referring to FIG. 3B, a dielectric layer 142 is conformally formed over the sacrificial layer 132. In some embodiments, the dielectric layer 142 is formed by a blanket deposition process such as a CVD process or any suitable process, and the second dielectric layer can be formed under a temperature lower than 400° C. A thickness of the dielectric layer 142 is less than 1 μm such as less than 0.5 μm. In some embodiments, since the dielectric layer 142 is formed with a small thickness, and thus a thickness reduction process such as a CPM process can be omitted. In some embodiments, a material of the dielectric layer 142 is the same as or different from a material of the sacrificial layer 132. In some embodiments, the material of the dielectric layer 142 may be silicon oxide or any suitable material.

Figure 3C:
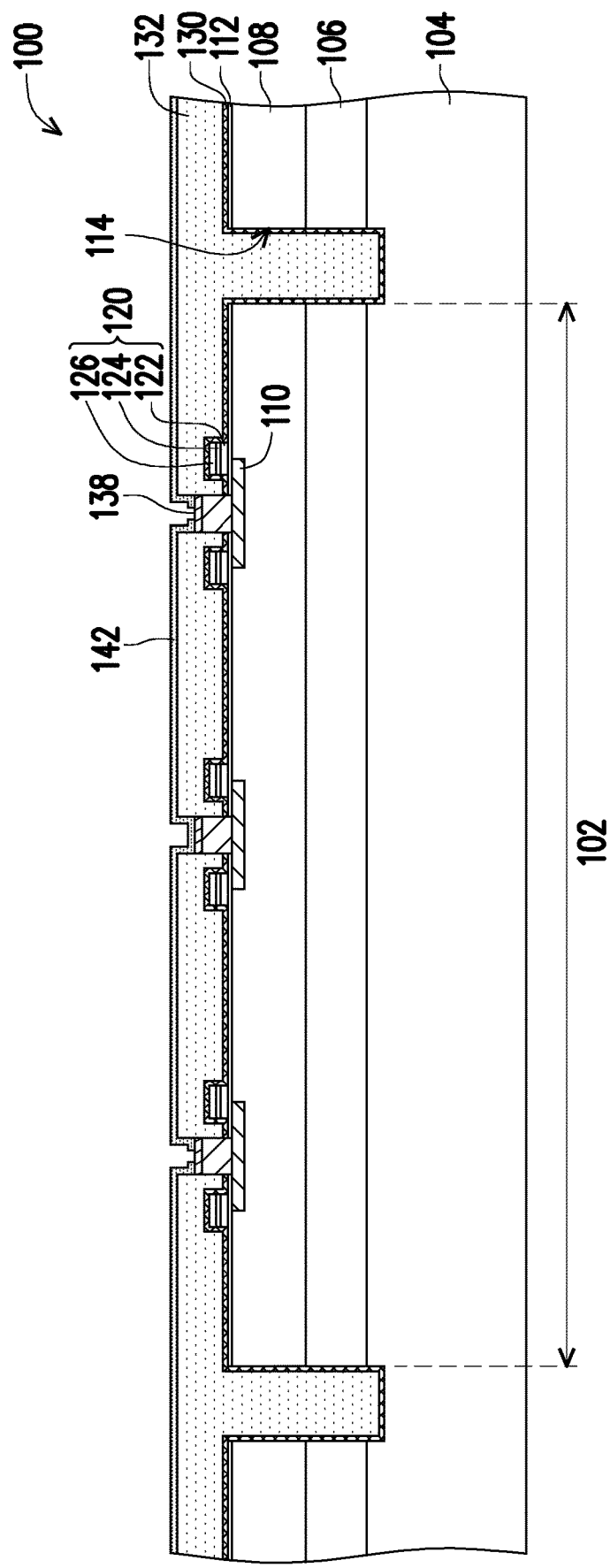

Referring to FIG. 3C, a portion of the dielectric layer 142 is removed to expose a portion of the bump 138. In some embodiments, the wafer 100 has a plurality of bumps 138 thereon, and at least one bump 138 is exposed by the dielectric layer 142 while at least one bump 138 is still covered by the dielectric layer 142, for example. In other words, the removal of the dielectric layer 142 over the bumps 138 determines the number of the bumps 138 for bonding. In some embodiments, the dielectric layer 142 is removed by an etching process such as a dry etching process or a wet etching process or an over-etching process.

Figure 4A:
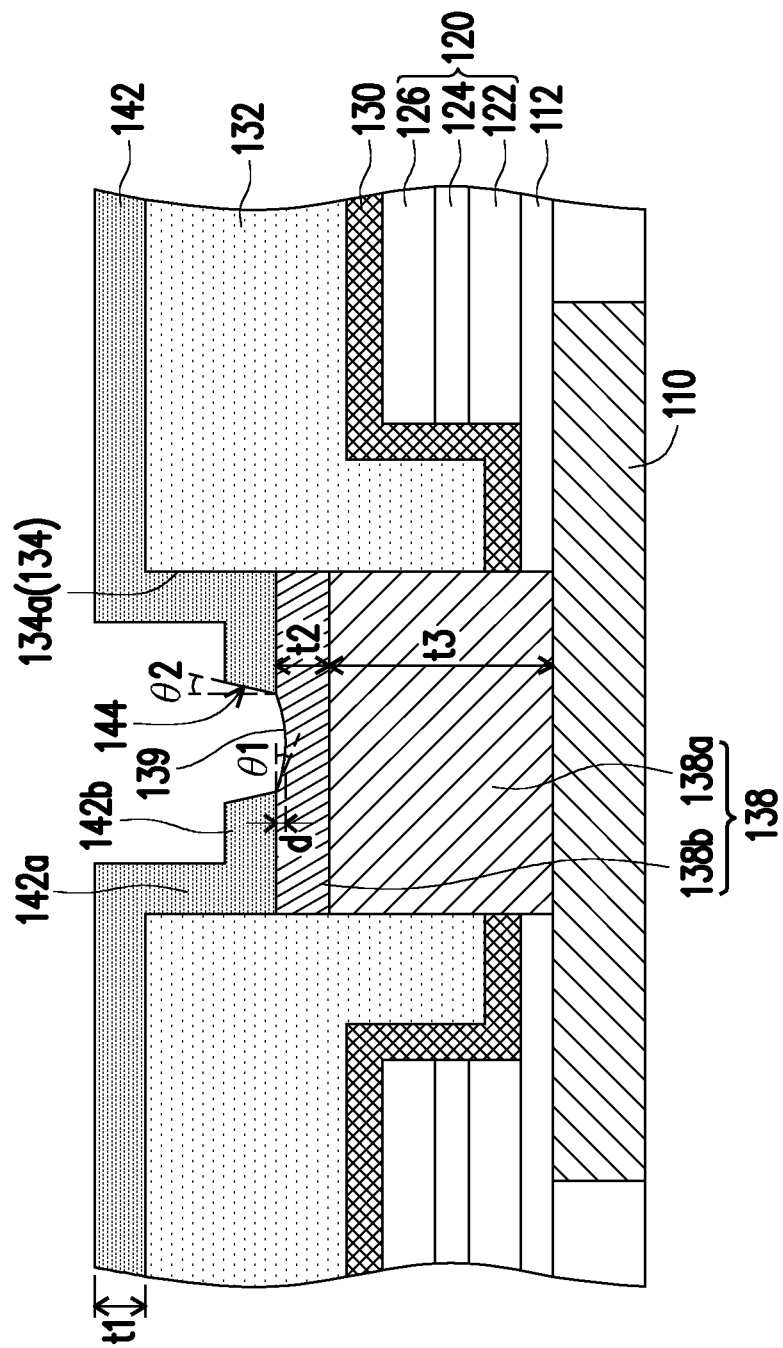
FIG. 4A is an enlarged partial view of FIG. 3C.
Figure 4B:
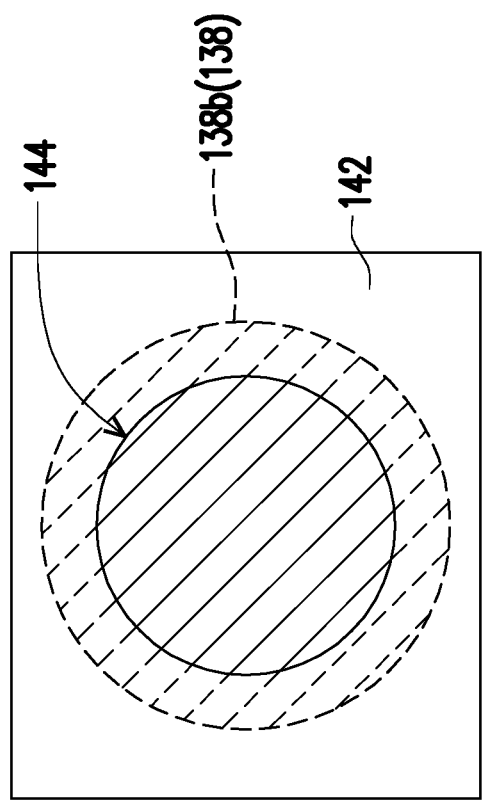
FIG. 4B is a top view of FIG. 4A, according to some exemplary embodiments.

FIG. 4A is an enlarged partial view of FIG. 3C, and FIG. 4B is a top view of FIG. 4A. Referring to FIG. 4A, in some embodiments, an opening 144 is formed in the dielectric layer 142 to expose the portion of the bump 138. In some embodiments, the remained dielectric layer 142 is horizontally extended on a portion of the top of the bump 138. In detail, the remained dielectric layer 142 includes a portion 142a disposed on a sidewall 134a of the opening 134 and a portion 142b extending onto the top of the bump 138, wherein the portion 142a and the portion 142b are continuously connected. In addition, a portion of the bump 138 is also removed by the removal process of the dielectric layer 142, and thus a recess 139 is formed in the top of the bump 138. In some embodiments, the recess 139 is formed in the solder 138b, for example. A depth d of the recess 139 is less than 10% of a thickness of the solder 138b, and is less than 500 angstroms, for example. An included angle θ1 between a tangent line of the recess 139 and an extending line of the top of the bump 138 is less than 45 degrees. An included angle θ2 between the sidewall of the opening 144 in the dielectric layer 142 and the vertical axis is less than 30 degrees. A thickness t1 of the dielectric layer 142 is less than 0.5 µm, for example. A thickness t2 of the solder 138b ranges from 0.01 µm to 0.5 µm, and a thickness t3 of the conductive pillar 138a ranges from 0.1 µm to 2 µm, for example. In some embodiments, a size of the bump 138 is smaller than 3 µm or 2 µm, and a pitch of the bump 138 is not smaller than 2 µm, for example. In alternative embodiments, after forming the opening 144 in the dielectric layer 142, the bump 138 may substantially remain intact without forming recess therein.

Referring to FIG. 4B, a shape of the opening 144 in the dielectric layer 142 is the same as or similar to the shape of the top surface of the bump 138. In some embodiments, a shape of the bump 138 is a circle, and a shape of the opening 144 is a circle, for example. An exposed area of the bump 138 by the opening 144 of the dielectric layer 142, which is the area of the bump 138 for contacting the adhesive layer 150 shown in FIG. 3D, is about 0.01% to 0.3% of the die region 102.

Figure 3D:
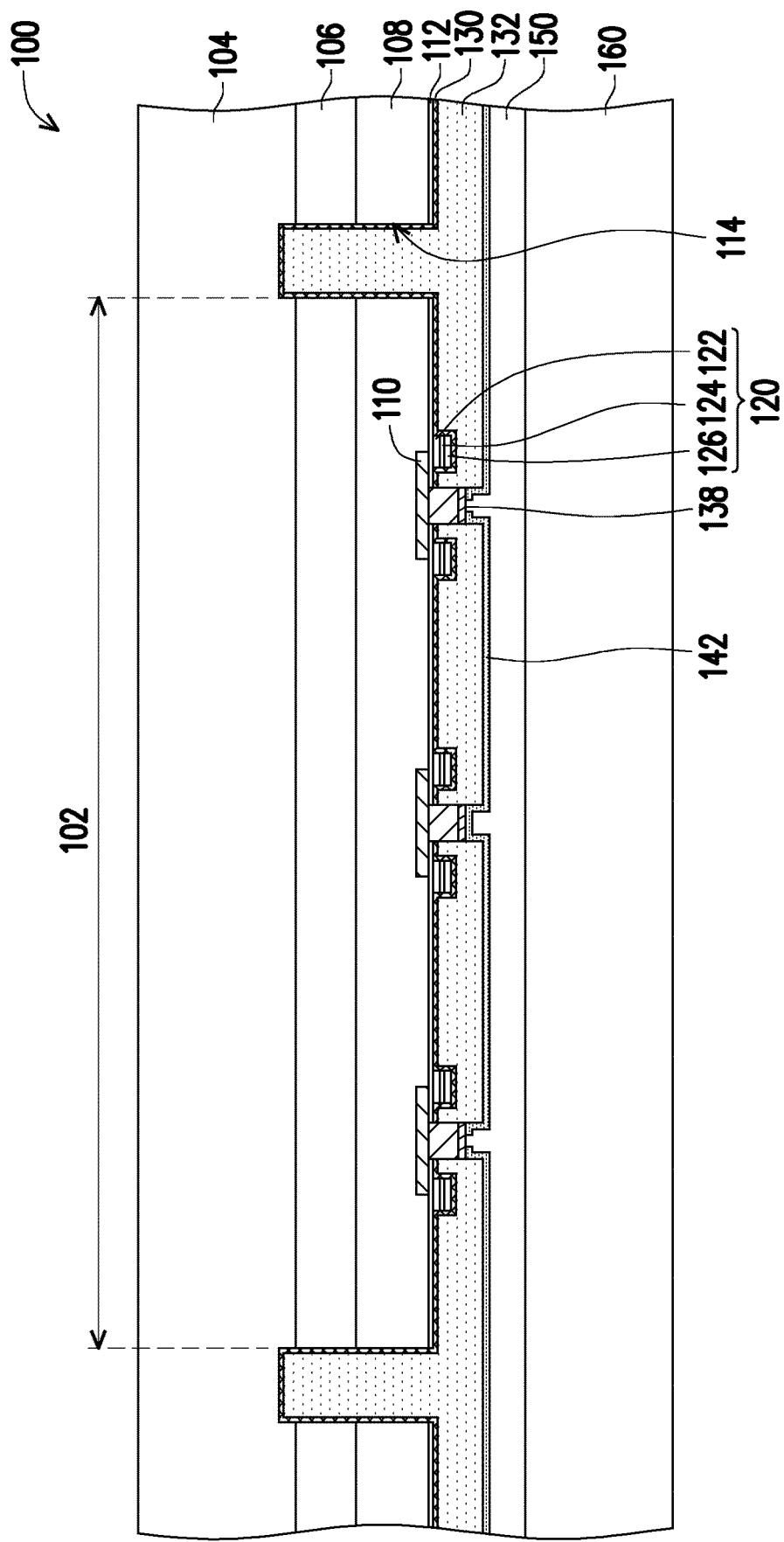

Referring to FIG. 3D, the wafer 100 is turned upside down and bonded to a carrier 160 through an adhesive layer 150, and the adhesive layer 150 is disposed between the carrier 160 and the wafer 100. In some embodiments, the adhesive layer 150 is in contact with the bump 138 by filling the space formed between the dielectric layer 142 and the bump 138. Thus, a portion of the adhesive layer 150 is extended into the space and is formed as a protrusion. The materials of the carrier 160 and the adhesive layer 150 can referred to the above embodiments, and the details thereof are omitted.

Figure 3E:
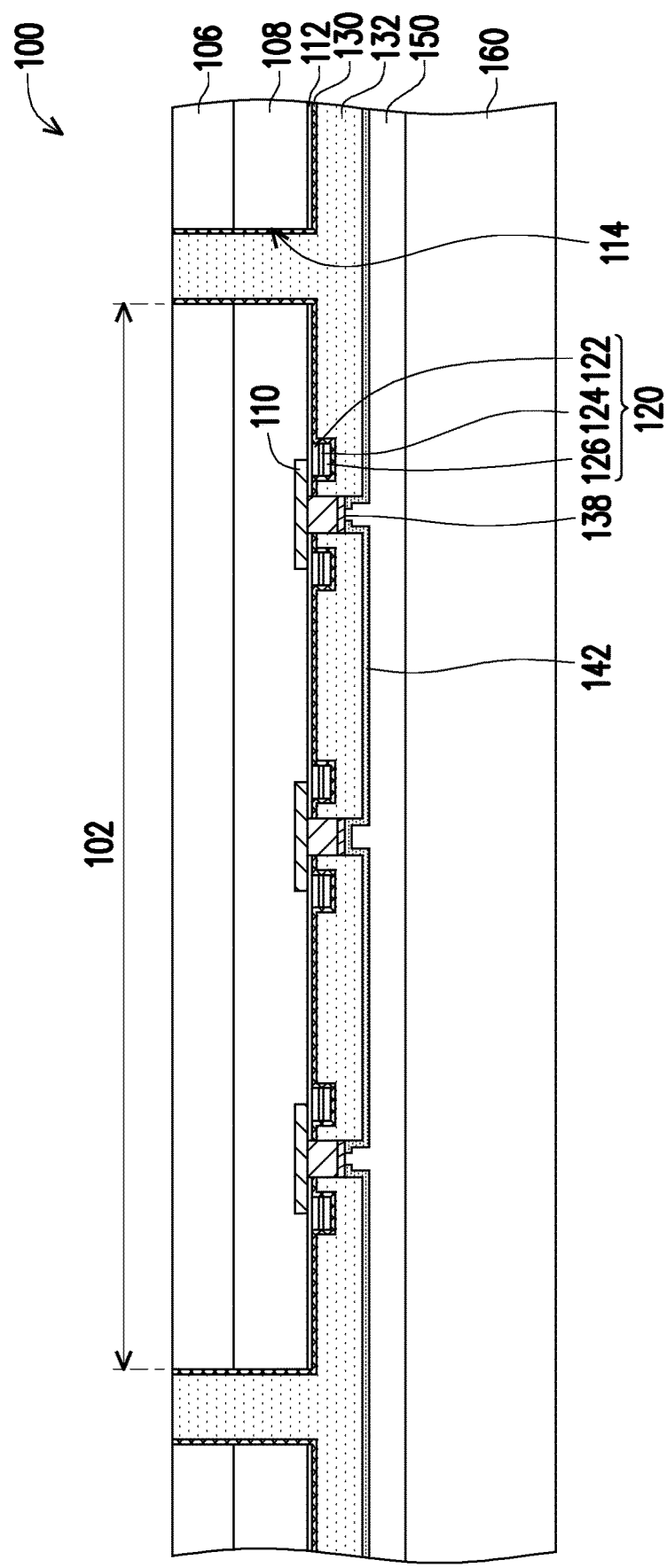

Referring to FIG. 3E, the substrate 104 is removed, so as to expose the sacrificial layer 132 in the trenches 114. In some embodiments, the substrate 104 is removed by a grinding process or a CMP process. In some embodiments, the etching stop layer 130 on the bottom surfaces of the trenches 114 in FIG. 3B is also removed, and thus the sacrificial layer 132 is exposed.

Figure 3F:
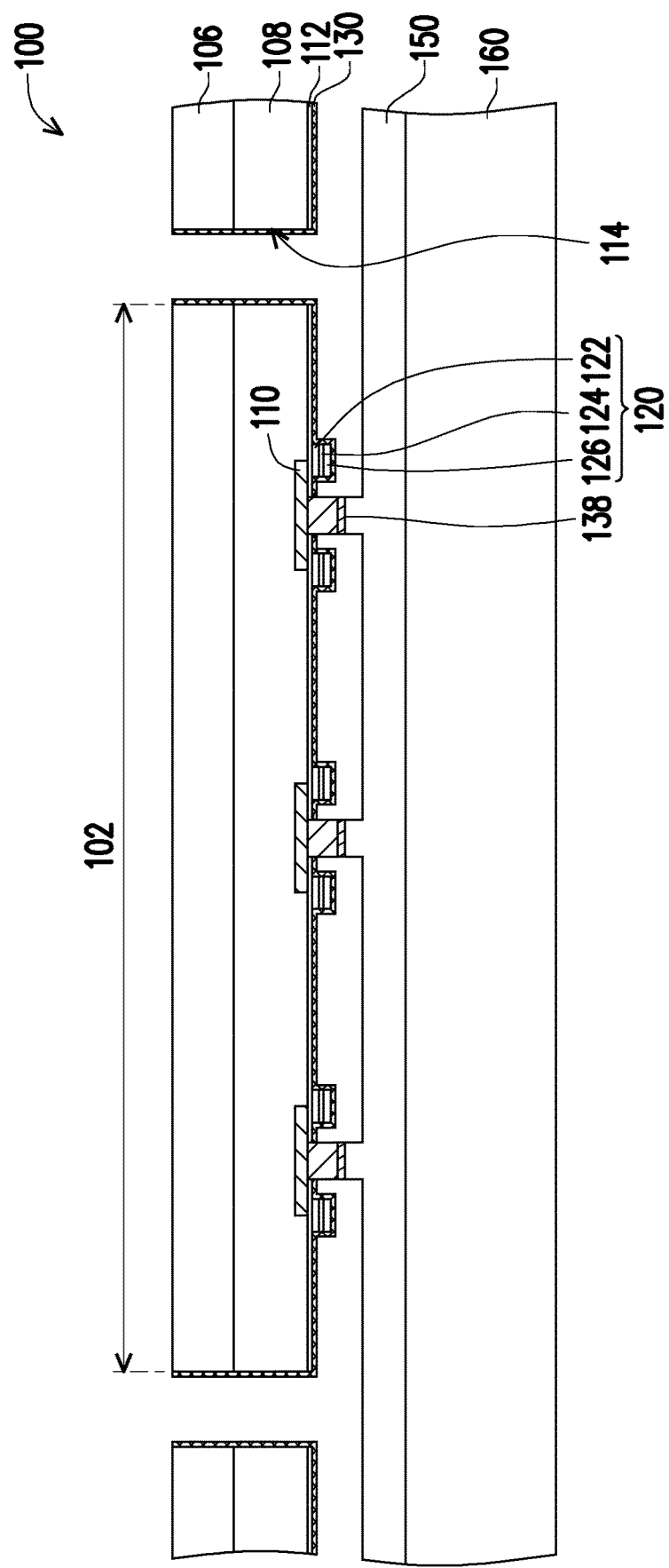

Referring to FIG. 3F, the sacrificial layer 132 and the dielectric layer 142 are removed, and a die 200 is formed. The sacrificial layer 132 and the dielectric layer 142 may be removed simultaneously or separately. In some embodiments, the sacrificial layer 132 and the dielectric layer 142 are removed through the exposed trenches 114. Particularly, the sacrificial layer 132 and the dielectric layer 142 are removed by using an etchant such as a vapor hydrogen fluoride (HF) or any suitable chemical, and the etchant is in contact with the sacrificial layer 132 and the dielectric layer 142 through the exposed trenches 114. In some embodiments, after removing the sacrificial layer 132 and the dielectric layer 142, the die 200 including the active device layer 106, the conductive structure 108, the dielectric layers 112 and 120, the etching stop layer 130 and the bumps 138 in the die region 102 is formed and separated from the other dies.

Figure 3G:
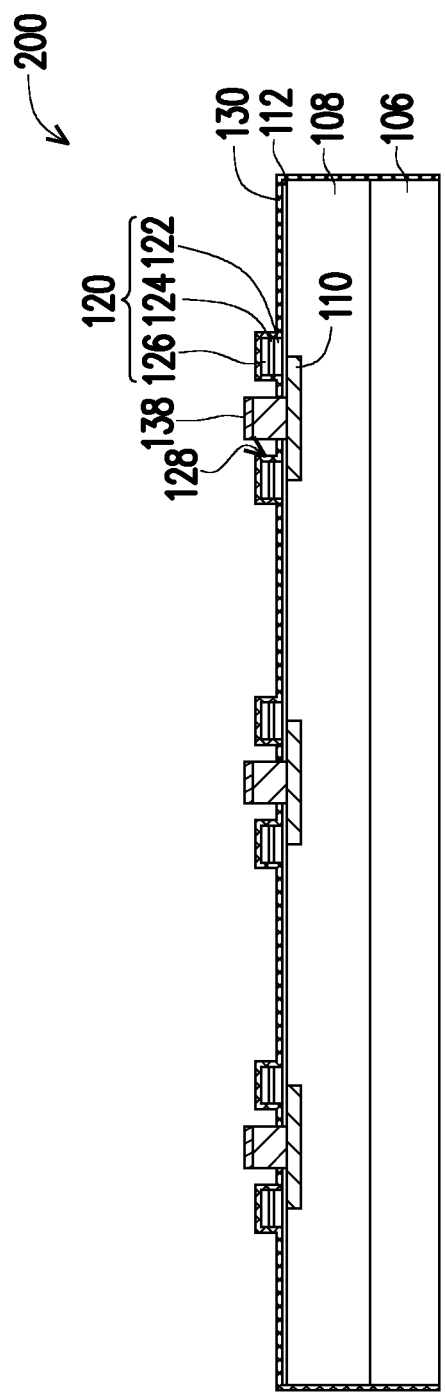

Referring to FIG. 3G, the die 200 is debonded from the carrier 160. In some embodiments, the bump 138 is partially disposed in the dielectric layer 112, and the etching stop layer 130 covers the side and top surfaces of the die 200 except the surfaces of the bumps 138. In some embodiments, the die 200 may be a micro-driver since the size thereof is not larger than 150 µm×30 µm, which is significantly smaller than a normal die size of 10 mm×10 mm.

In some embodiments, the dielectric layer (i.e., the dielectric layer 142) exposing a portion of the bump is formed with a thin thickness under a low temperature, and thus the thermal budget may be significantly reduced and the thickness reduction process for the dielectric layer can be omitted. Additionally, the copper contamination into the bump caused by the conductive layer due to high temperature is prevented. The recess effect on the surface of the bump is decreased as the removed thickness of the dielectric layer is reduced, that is, a depth of the recess is reduced. Accordingly, the bump has a smooth surface, and the pick and place yield of the die is extremely improved. Furthermore, in some embodiments, the bump has a circle or a circle-like shape, and therefore the accumulation of stress and charge (such as galvanic effect) and the formation of nodule in the corner of the square bump are prevented. Accordingly, a ratio of nodule defect bump to total bumps in one die may be lower than $2.5 \times 10^{-5}$ ppm, which is significantly improved. Due to the nodule defect in the corner of the bump is eliminated, a holding force between the adhesion layer and the bump is good. Therefore, the manufacturing method of the semiconductor device has a reduced cost and an improved yield.

According to some embodiments, a semiconductor device includes a first dielectric layer, a bump, an etching stop layer and a spacer. The first dielectric layer is disposed over and exposes a conductive structure. The bump is partially disposed in the first dielectric layer to electrically connect the conductive structure. The etching stop layer is disposed over the first dielectric layer aside the bump. The spacer surrounds the bump and disposed between the etching stop layer and the bump.

According to some embodiments, a semiconductor device includes a plurality of dielectric patterns, a bump and an etching stop layer. The dielectric patterns are disposed over a conductive structure. The bump is disposed between the plurality of dielectric patterns to electrically connect the conductive structure. The etching stop layer is conformally disposed over the plurality of dielectric patterns and between the plurality of dielectric patterns and the bump.

According to some embodiments, a semiconductor device includes a plurality of dielectric patterns, a bump and an etching stop layer. The dielectric patterns are disposed over and exposes a conductive structure. The bump is disposed between the plurality of dielectric patterns to electrically connect the conductive structure, wherein a recess is disposed at a top surface of the bump. The etching stop layer is disposed over sidewalls and top surfaces of the plurality of dielectric patterns and between the plurality of dielectric patterns and the bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first dielectric layer, disposed over and exposing a conductive structure;
a bump, partially disposed in the first dielectric layer to electrically connect the conductive structure;
an etching stop layer, disposed over the first dielectric layer aside the bump, comprising a first portion, a second portion and a third portion between the first and second portions, wherein the first portion and the second portion are substantially extended along a horizontal direction, the third portion is substantially extended along a vertical direction, a top surface of the first portion is substantially disposed at a first height, a top surface of the second portion is substantially disposed at a second height higher than the first height; and
a spacer, surrounding the bump and disposed between the etching stop layer and the bump, wherein a projection area of the spacer on a top surface of the first dielectric layer is not overlapped with a projection area of the etching stop layer on the top surface of the first dielectric layer, and a portion of the spacer at a height between the first height and the second height is separated from the third portion by the first portion.

2. The semiconductor device as claimed in claim 1, wherein the spacer is in contact with the first portion of the etching stop layer and the bump.

3. The semiconductor device as claimed in claim 1, wherein the bump comprises a conductive pillar and a solder thereon.

4. The semiconductor device as claimed in claim 1, further comprising a second dielectric layer between the second portion of the etching stop layer and the top surface of the first dielectric layer, wherein the first portion of the etching stop layer is extended over the first dielectric layer between the spacer and the second dielectric layer, the second portion of the etching stop layer is extended over a top surface of the second dielectric layer, and the third portion of the etching stop layer is extended along an inner sidewall of the second dielectric layer.

5. The semiconductor device as claimed in claim 1, wherein a bottom surface of the spacer is substantially flush with a bottom surface of the first portion of the etching stop layer.

6. The semiconductor device as claimed in claim 1, wherein a top surface of the bump is higher than a top surface of the spacer.

7. A semiconductor device, comprising:
a plurality of dielectric patterns over a conductive structure;
a bump, disposed between the plurality of dielectric patterns to electrically connect the conductive structure; and
an etching stop layer, disposed over the plurality of dielectric patterns and between the plurality of dielectric patterns and the bump, wherein a projection area of the etching stop layer on a bottom surface of the semiconductor device is not overlapped with a projection area of the bump on the bottom surface of the semiconductor device, and the etching stop layer is, and a top surface of the bump is higher than a top surface of the etching stop layer.

8. The semiconductor device as claimed in claim 7, wherein the etching stop layer is in contact with the plurality of dielectric patterns.

9. The semiconductor device as claimed in claim 7, wherein the etching stop layer is in contact with a bottom portion of a sidewall of the bump.

10. The semiconductor device as claimed in claim 7, wherein the etching stop layer is continuously disposed between the plurality of dielectric patterns and the bump.

11. The semiconductor device as claimed in claim 7, further comprising a spacer on a sidewall of the bump.

12. The semiconductor device as claimed in claim 11, wherein the etching stop layer is continuously disposed between the plurality of dielectric patterns and the spacer.

13. A semiconductor device, comprising:
a conductive structure, comprising a dielectric layer and a conductive pattern in the dielectric layer;
a plurality of dielectric patterns, disposed over the conductive structure;
a bump, disposed between the plurality of dielectric patterns to electrically connect the conductive structure; and
an etching stop layer, disposed over sidewalls and top surfaces of the plurality of dielectric patterns and between the plurality of dielectric patterns and the bump, wherein a projection area of the etching stop layer on a bottom surface of the semiconductor device is not overlapped with a projection area of the bump on the bottom surface of the semiconductor device, and the etching stop layer is extended along and in direct contact with outer sidewalls of the conductive structure.

14. The semiconductor device as claimed in claim 13, wherein the bump comprises a conductive pillar and a solder thereon, and a recess is disposed at a top surface of the solder.

15. The semiconductor device as claimed in claim 13, further comprising a spacer on a sidewall of the bump.

16. The semiconductor device as claimed in claim 13, wherein the etching stop layer is continuously disposed between the plurality of dielectric patterns and the bump.

17. The semiconductor device as claimed in claim 13 further comprising a recess disposed at a top surface of the bump, wherein a bottom of the recess is higher than top surfaces of portions of the etching stop layer over the plurality of dielectric patterns.

18. The semiconductor device as claimed in claim 13 further comprising a recess disposed at a top surface of the bump, wherein an included angle between a tangent line of the recess and an extending line of the top surface of the bump is less than 45 degrees.

19. The semiconductor device as claimed in claim 13, wherein the outer sidewalls of the conductive structure are entirely covered by the etching stop layer.

20. The semiconductor device as claimed in claim 13, wherein the etching stop layer is continuously disposed on the sidewalls and the top surfaces of the plurality of dielectric patterns and the outer sidewalls of the conductive structure.

* * * * *